United States Patent
Jung

(10) Patent No.: US 7,666,556 B2
(45) Date of Patent: Feb. 23, 2010

(54) METHOD FOR MANUFACTURING PHOTOMASK

(75) Inventor: Ho Yong Jung, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 281 days.

(21) Appl. No.: 11/770,527

(22) Filed: Jun. 28, 2007

(65) Prior Publication Data

US 2008/0160426 A1 Jul. 3, 2008

(30) Foreign Application Priority Data

Dec. 29, 2006 (KR) .................. 10-2006-0138841

(51) Int. Cl.
*G03F 1/00* (2006.01)
(52) U.S. Cl. ........................................ 430/5
(58) Field of Classification Search .............. 430/5, 430/30, 394; 204/192.1, 192.34
See application file for complete search history.

(56) References Cited

U.S. PATENT DOCUMENTS

| 6,566,016 | B1 * | 5/2003 | Ziger ........................ 430/5 |
| 6,777,141 | B2 | 8/2004 | Pierrat |
| 6,861,204 | B2 | 3/2005 | Cote et al. |
| 2006/0019174 | A1 * | 1/2006 | Ahn et al. ...................... 430/5 |
| 2006/0019176 | A1 | 1/2006 | Kim et al. |

FOREIGN PATENT DOCUMENTS

| JP | 9-061990 | 3/1997 |
| KR | 10-2006-0007777 | 1/2006 |

* cited by examiner

*Primary Examiner*—Stephen Rosasco
(74) *Attorney, Agent, or Firm*—Marshall, Gerstein & Borun LLP

(57) ABSTRACT

A method for manufacturing a photomask includes forming a mask pattern to be transferred onto a wafer on a transparent substrate; transferring the mask pattern on a wafer to form a wafer pattern; selecting a critical dimension modification region requiring a line width modification in the pattern transferred onto the wafer; forming a resist pattern for selectively exposing a portion of the substrate corresponding to the critical dimension modification region; varying a light transmittance of the exposed portion of the substrate by implanting ions into the exposed portion using the resist pattern as an ion implantation mask; and selectively removing the resist pattern.

14 Claims, 5 Drawing Sheets

METHOD FOR MANUFACTURING PHOTOMASK

CROSS-REFERENCE TO RELATED APPLICATION

The priority of Korean patent application number 10-2006-0138841, filed on Dec. 29, 2006, the disclosure of which is incorporated by reference in its entirety, is claimed.

BACKGROUND

The invention relates to the manufacture of semiconductor devices and, more particularly, to a method for manufacturing a photomask used in a photolithography process.

During the manufacture of semiconductor devices, a photolithography process is performed to transcribe a circuit pattern on a wafer. The photolithography process uses a photomask having a mask pattern for the circuit pattern to be transcribed. As the design rule of semiconductor devices reduces, the photomask is manufactured to have a phase shift mask (PSM) structure including a mask pattern of a phase shift layer to improve resolution in an exposure process. A phase shift mask (PSM) improves pattern resolution in the exposure process by using an interference phenomenon due to a phase difference between light passing through a quartz mask substrate and light passing through the mask pattern of the phase shift layer. However, after the PSM is manufactured, it is occasionally necessary to modify or correct the line width of the mask pattern of the PSM.

FIGS. 1 and 2 are schematic diagrams for explaining a wafer exposure process using the phase shift mask (PSM).

Referring to FIG. 1, a phase shift mask (PSM) 20 including a transparent quartz mask substrate 21 and a mask pattern 23 of a phase shift layer disposed on the quartz mask substrate 21 is provided on the wafer to perform the exposure process. In this case, a wafer pattern having a desired line width may not be transcribed on the wafer and, as a result, a line width variation may occur in a certain portion of the wafer. In order to check whether the line width variation occurs, the line width of the wafer pattern (e.g., the photoresist pattern) formed on the wafer after the exposure process is measured to provide line width data, i.e., critical dimension (CD) data in a wafer map as shown in FIG. 2. By inspecting a wafer map 11 representing the line width a CD variation may be detected in a region of interest 12.

As for the region 12 where the CD variation is detected, it may be necessary to modify the line width of the mask pattern. 23 of the PSM 20. However, in case of an attenuated PSM, it is difficult to modify or correct the mask pattern by feeding back the line width data of the wafer pattern. Accordingly, in order to feed back the line width data onto the PSM, in substance it is necessary to manufacture a new PSM. Therefore, in order to reduce the time and cost required for the manufacture of the new PSM, it is necessary to develop a method for modifying the mask pattern of the PSM or for rectifying the line width variation of the wafer pattern on the PSM.

BRIEF SUMMARY OF THE INVENTION

The invention provides a method for manufacturing a photomask comprising the steps of: forming a mask pattern to be transferred onto a wafer on a transparent mask substrate; transferring the mask pattern to the wafer to form a wafer pattern; selecting a critical dimension (CD) modification region requiring line width modification in the wafer pattern transferred onto the wafer; forming a resist pattern for selectively exposing a portion of the mask substrate corresponding to the critical dimension modification region; varying a light transmittance of the exposed portion of the mask substrate by implanting ions into the exposed portion using the resist pattern as an ion implantation mask; and selectively removing the resist pattern.

Another aspect of the invention provides a method for manufacturing a phase shift mask comprising the steps of: forming a phase shift layer pattern on a transparent mask substrate; transferring the phase shirt pattern to a wafer to form a wafer pattern; selecting a critical dimension (CD) modification region requiring line width modification in the wafer patterns transferred on the wafer; forming a resist pattern to cover the mask pattern and to selectively expose a portion of the mask substrate corresponding to the critical dimension (CD) modification region, varying the light transmittance of the exposed portion of the mask substrate by implanting ions into the exposed portion using the resist pattern as an ion implantation mask; and selectively removing the resist pattern.

The step of selecting a critical dimension modification region preferably includes the steps of: measuring critical dimensions (CDs) of the wafer pattern; extracting a region where the critical dimension (CD) of the wafer pattern is varied; and selecting a region of the mask substrate corresponding to the extracted region of critical dimension (CD) variation as the critical dimension (CD) modification region.

The region where the critical dimension (CD) of the wafer pattern is varied preferably includes a region provided with light having a relatively high intensity.

The step of forming a resist pattern preferably includes the steps of: coating a resist layer covering a front side surface of the mask substrate; selectively irradiating exposure light onto the critical dimension (CD) modification region at a back side surface of the mask substrate; and selectively developing an exposed portion of the resist layer self-aligned onto the portion of the mask substrate without the mask pattern.

The step of selectively irradiating exposure light preferably includes the steps of: introducing a light blocking blade exposing the modification region at the back side surface of the mask substrate; and irradiating the exposure light onto the region exposed through the light blocking blade.

The implanted ions are preferably gallium (Ga) ions. A reduction amount of a transmittance of the ion-implanted portion of the mask substrate is preferably adjusted by controlling implantation time of the Ga ions. The ions are preferably implanted by using a focused ion beam (FIB) apparatus.

DETAILED DESCRIPTION OF THE INVENTION

In a preferred embodiment, the invention provides a method for correcting critical dimensions (CDs) of wafer patterns by feeding back CD distribution of the pattern formed on a test wafer by using an attenuated PSM. There is provided a method for modifying CDs of patterns formed on a wafer by controlling the transmittance of a quartz mask substrate of the PSM corresponding to a region requiring CD modification in the pattern transferred onto the wafer.

The transmittance of light passing through the mask substrate is varied, and as a result the intensity of exposure light during an exposure of a wafer is varied. Accordingly, an interference effect between one light passing through the mask substrate and other light passing through the mask pattern of the phase shift layer made of, for example, molybdenum silicon nitride (MoSiN) can be changed. Thus, the CD of the wafer pattern on the wafer can be varied. The light transmittance of the mask substrate can be partially varied, thereby overcoming nonuniformity of the CD of the wafer pattern.

Figure 8:
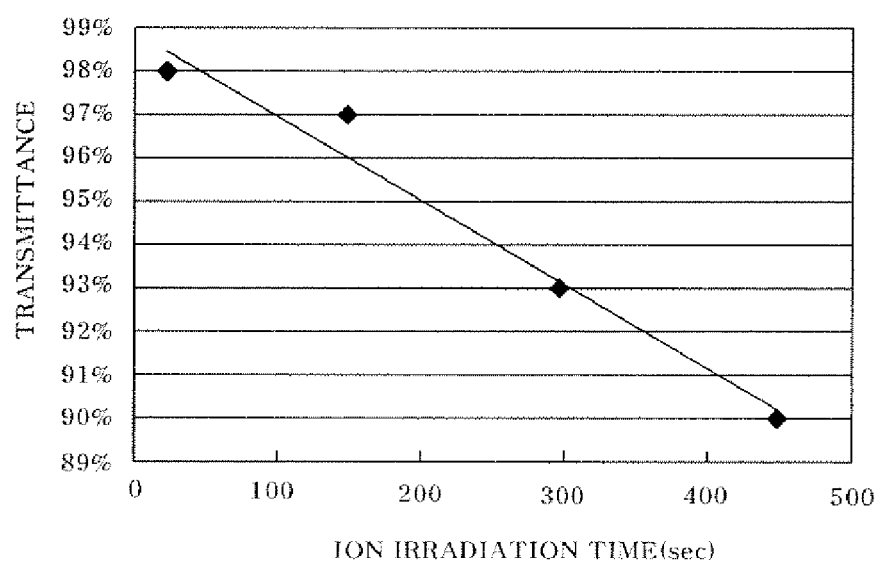
FIG. 8 is a graph showing a transmittance of a quartz substrate varied according to gallium (Ga) ion irradiation time in accordance with a preferred embodiment of the invention.
Figure 9:
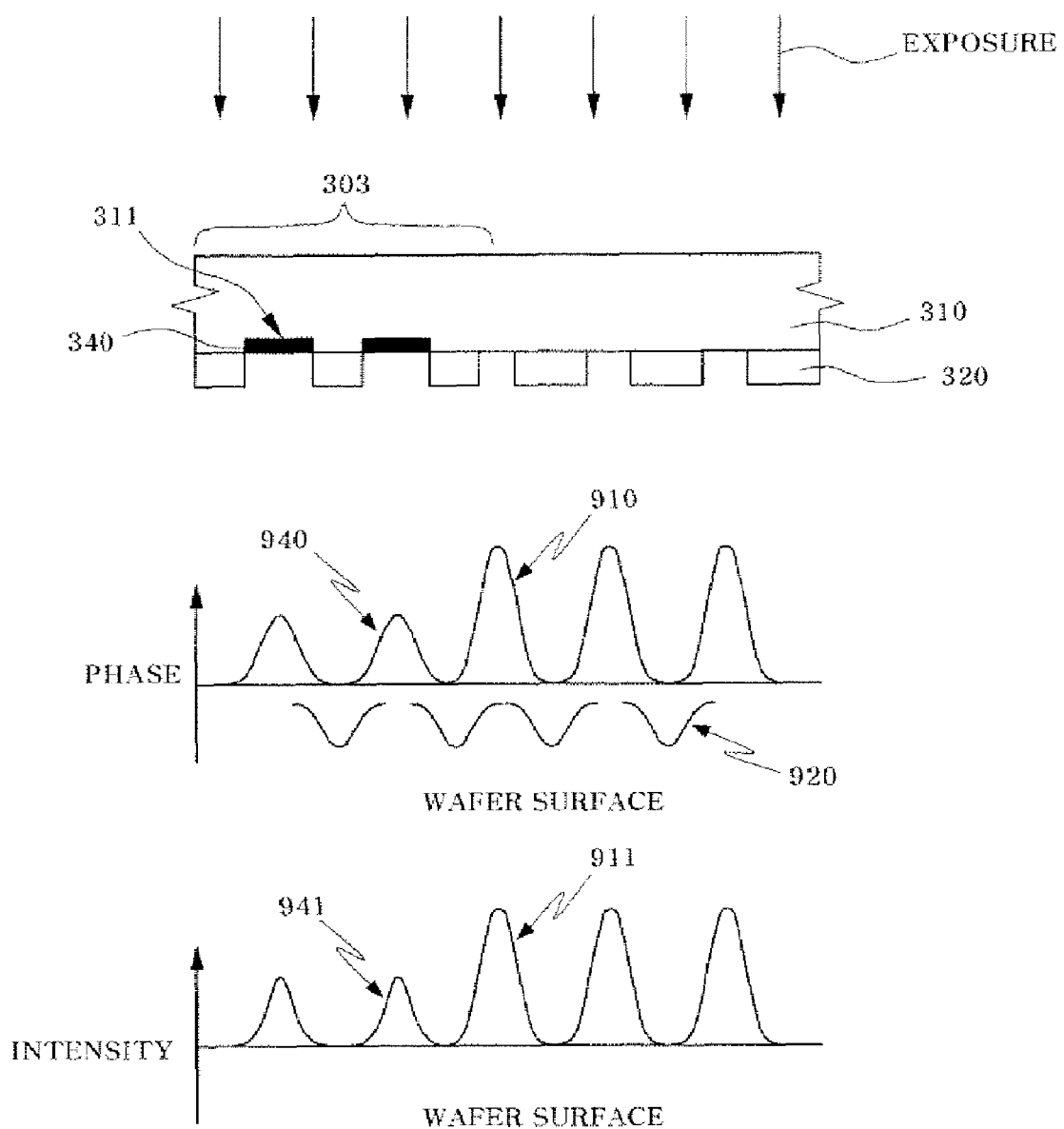
FIG. 9 is a schematic diagram for explaining exposure characteristics when the phase shift mask is used according to a preferred embodiment of the present invention.

FIGS. 3 to 7 schematically show cross sectional views for explaining a method of manufacturing a phase shift mask (PSM) according to a preferred embodiment of the invention. FIG. 8 is a graph showing a transmittance of a quartz substrate varied according to gallium (Ga) ion irradiation time in accordance with a preferred embodiment of the invention. FIG. 9 Is a schematic diagram for explaining exposure characteristics when the phase shift mask is used according to a preferred embodiment of the invention.

Figure 1:
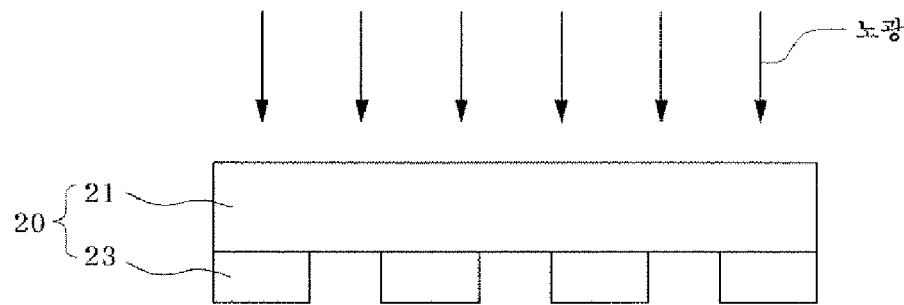
FIGS. 1 and 2 are schematic diagrams for explaining a wafer exposure process using the phase shift mask (PSM)
Figure 2:
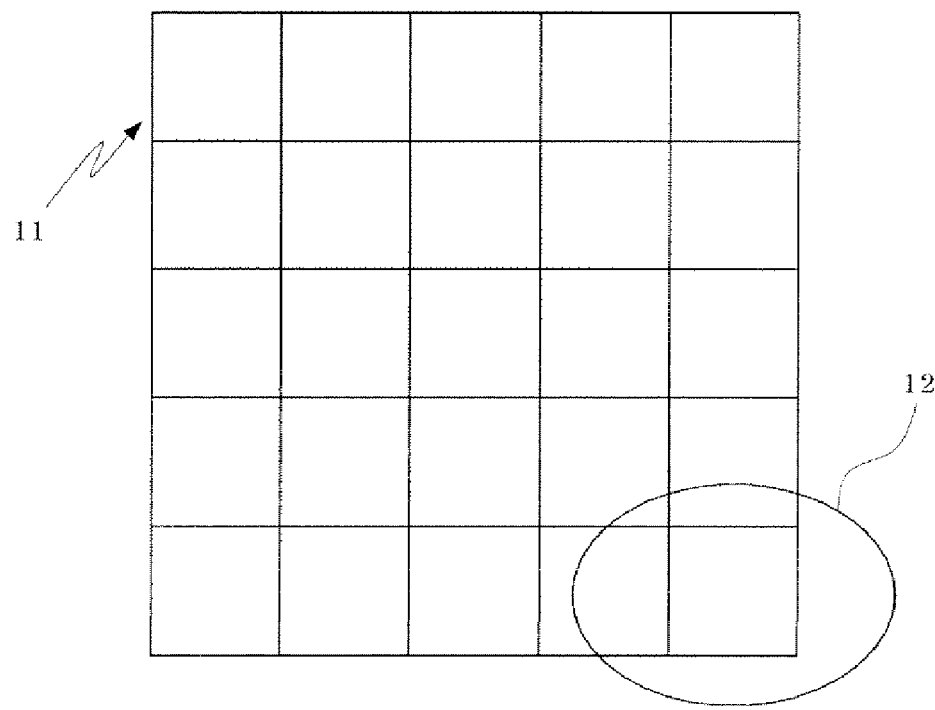
Figure 3:
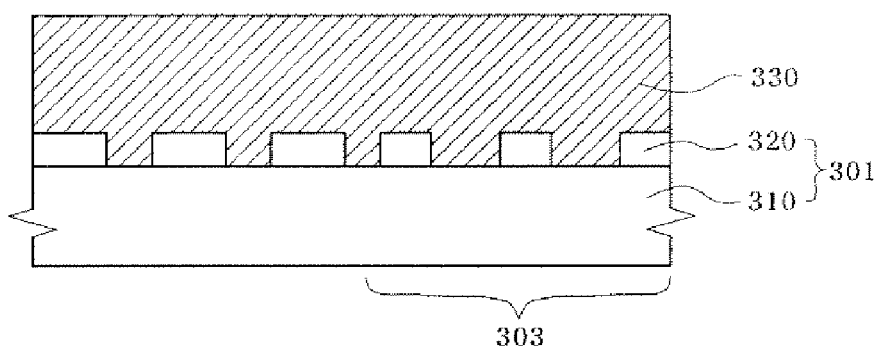
FIGS. 3 to 7 schematically show cross sectional views for explaining a method of manufacturing a photomask according to a preferred embodiment of the invention.

Referring to FIG. 3, in the method of manufacturing the phase shift mask (PSM) according to a preferred embodiment of the invention, preferably, a mask pattern 320 including a phase shift layer is formed on a transparent quartz mask substrate 310. The transmittance of the mask pattern 320 is typically about 6%. An exposure process for transferring the pattern on a wafer using a phase shift mask 301 that is primarily formed as mentioned above is performed as shown in FIG. 1. Then, the CDs of the wafer patterns transferred on the wafer are measured to obtain the wafer map 11 representing the CD distribution shown in FIG. 2.

The region 12, shown in FIG. 2, requiring CD modification of the wafer pattern may be extracted. A modification region 303 corresponding to the extracted region 12 is set on the mask substrate 310. After the modification region 303 requiring CD modification is set on the mask substrate 310, a resist layer 330 covering the mask pattern 320 is formed on the mask substrate 310 using any suitable coating method. In this case, the resist layer 330 illustratively includes a photoresist layer used in the exposure to ultraviolet (UV) rays, KrF, ArF, or the like.

Figure 4:
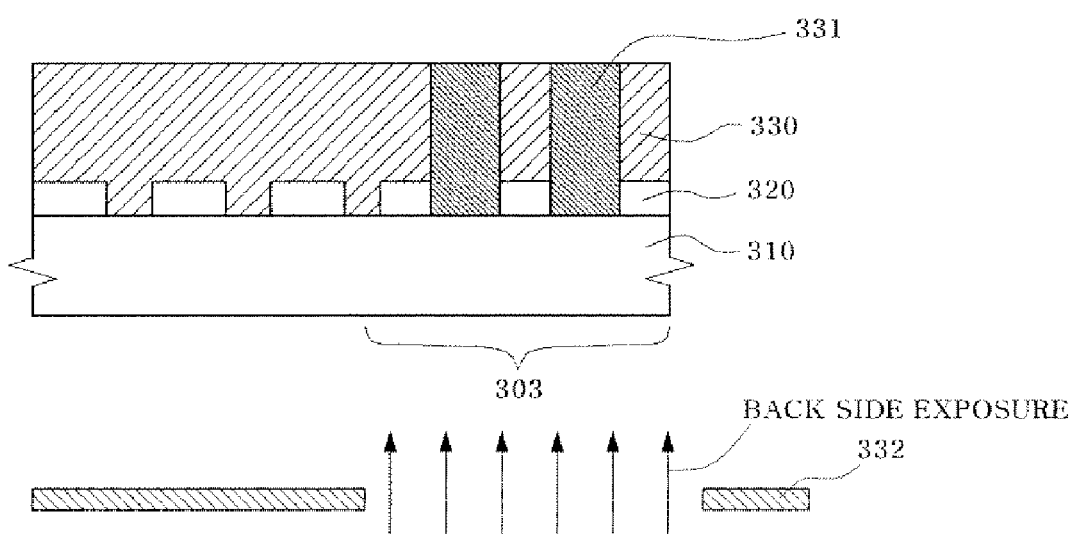

Referring to FIG. 4, a back side exposure is performed on the modification region 303 by selectively exposing the mask substrate 310 to exposure light. In this case, a light blocking blade 332 having an opening portion selectively opening the modification region 303 may be used in the back side exposure such that the exposure light can be selectively irradiated on the modification region 303.

Since the transmittance of the mask substrate 310 is substantially 100%, the exposure light penetrates the mask substrate 310 and is projected onto the resist layer 330 coated on the mask substrate 310. In contrast, since the mask pattern 320 of the phase shift layer formed on the mask substrate 310 typically has a transmittance of about 6%, the exposure light passing through the mask pattern 320 does not have enough intensity to substantially expose the resist layer 330 when the exposure light is projected onto the resist layer 330. Accordingly, a resist layer portion self-aligned onto the mask pattern 320 is not exposed to light. The resist layer portion 331 self-aligned onto a portion of the mask substrate 110, not the mask pattern 320, can be selectively exposed to light.

Figure 5:
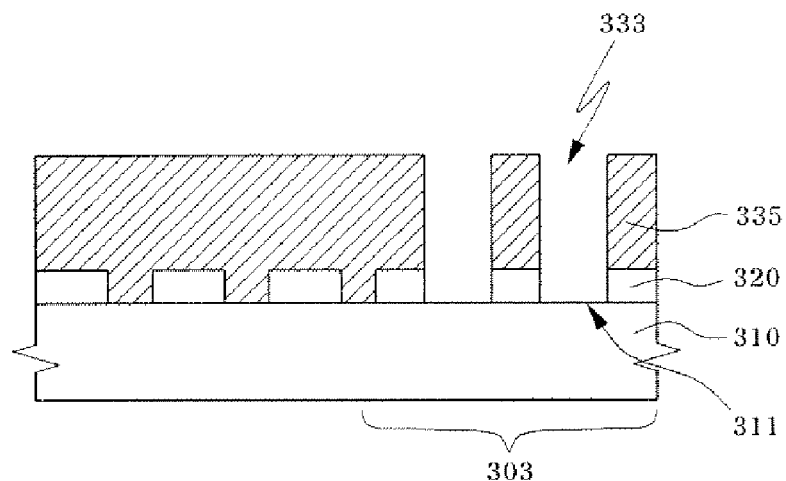

Referring to FIG. 5, the resist layer 330 is developed to remove the exposed resist layer portion 331. Accordingly a resist pattern 335 is formed and the resist pattern 335 includes an opening portion 333 exposing a portion 311 of the mask substrate 310.

Figure 6:
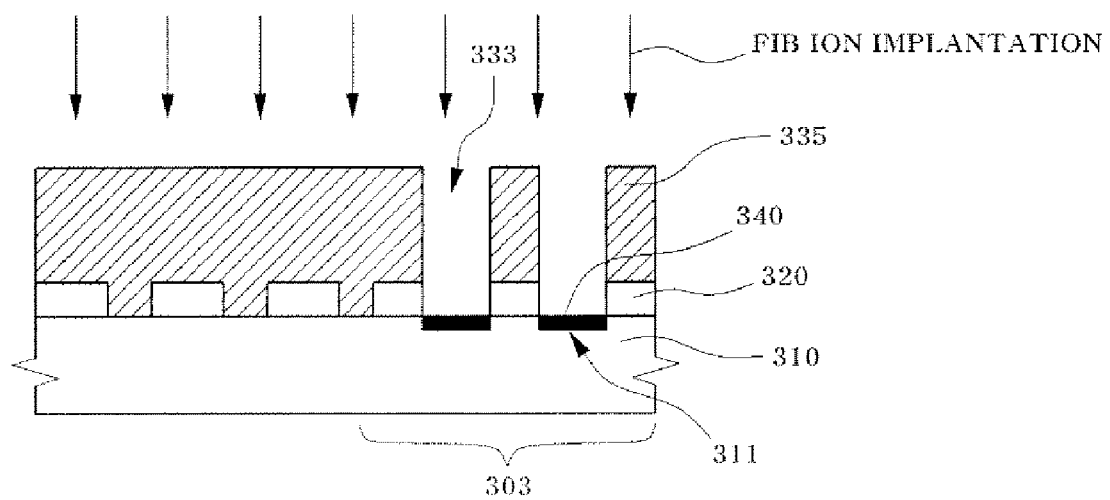

Referring to FIG. 6, ion implantation using the resist pattern 335 as an ion implantation mask is performed on the portion 311 of the mask substrate 310 exposed through the opening portion 333. In this case, Ga ions may be implanted to form an ion implantation layer 340. The ion implantation layer 340 enables the transmittance of the portion 311 to be varied. The ion implantation may be performed by using an ion implantation device such as a focused ion beam (FIB) device. A measurement graph shown in FIG. 8 represents the transmittance of the quartz substrate varied according to Ga ion irradiation (or implantation) time (see), wherein the transmittance decreases approximately linearly with implantation time. Therefore, the transmittance of the exposed portion 311 of the mask substrate 310 can be varied by controlling Ga ion implantation time.

When the transmittance of the portion 311 of the mask substrate 310 is reduced by the Ga ion implantation, as shown in FIG. 9, the intensity of the electric field of the exposure light phase passing the portion 311 is varied. That is, an intensity value 940 of the light phase passing through the portion 311, on which the ion implantation layer 340 is formed, becomes smaller than an intensity value 910 of light phase passing through the mask substrate 310. Meanwhile, an intensity value 920 of light passing through the mask pattern 320 of the phase shift layer does not substantially vary. Thus, when observing the intensity distribution of light substantially projected onto the surface of the wafer while interference due to phase difference is taken into account, an intensity 941 of light passed through the portion 311, on which the ion implantation layer 340 is formed, becomes smaller than an intensity 911 of light passed through the mask substrate 310.

As described above, the intensity of the exposure light projected onto the wafer through the CD modification region 303 becomes relatively smaller. Accordingly, the CD of a space pattern transferred onto a wafer region corresponding to the CD modification region 303 becomes relatively smaller. Thus, the intensity of the exposure light projected onto the surface of the wafer can be controlled by varying the transmittance of light passing through the CD modification region 303 of the mask substrate 310. Therefore, the CDs of the wafer patterns can be varied, thereby obtaining CD uniformity of the wafer pattern.

Figure 7:
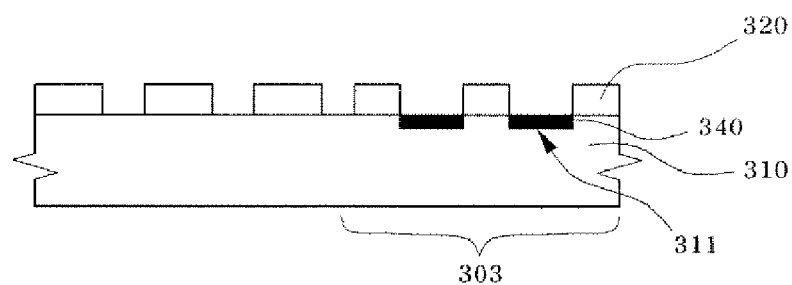

After controlling the transmittance of light passing through the CD modification region 303 as shown in FIG. 6, the resist pattern 335 used as the ion implantation mask is selectively removed as shown in FIG. 7.

According to the invention, a mask modification for compensating a CD variation of the wafer pattern can be performed without requiring manufacture of a new mask by selectively varying the transmittance of light passing through of the manufactured phase shift mask (PSM) in a related region. Accordingly the uniformity of the CD of the wafer pattern can be improved, and the cost required of the manufacture of a new mask and manufacturing time can be reduced.

Although preferred embodiments of the invention have been disclosed for illustrative purposes, various modifications, additions, and substitutions are possible, without departing from the scope and spirit of the invention as disclosed in the accompanying claims.

What is claimed is:

1. A method for manufacturing a photomask, comprising the steps of:
    forming a mask pattern to be transferred onto a wafer over a transparent substrate;
    transferring the mask pattern to the wafer to form a wafer pattern;
    selecting a critical dimension modification region requiring line width modification in the wafer pattern transferred onto the wafer;
    coating a resist layer covering a front side surface of the mask substrate;
    performing back side exposure on a back side surface of the modification region of the substrate to selectively irradiate a portion of the resist layer between the mask patterns;
    selectively developing the irradiated portion of the resist layer to form a resist pattern covering and being self-aligned with the mask pattern to selectively expose a portion of the substrate between the mask pattern;
    varying light transmittance of the exposed portion of the substrate by implanting ions into said exposed portion using the resist pattern as an ion implantation mask to protect the mask pattern from being damaged by the implanting ions; and
    selectively removing the resist pattern.

2. The method according to claim 1, wherein the step of selecting a critical dimension modification region comprises the steps of:
    measuring critical dimensions of the wafer pattern;
    extracting a region where the critical dimension of the wafer pattern is varied; and
    selecting a region of the substrate corresponding to the extracted region of critical dimension variation as the critical dimension modification region.

3. The method according to claim 2, wherein the region where the critical dimension of the wafer pattern is varied includes a region provided with light having a relatively high intensity.

4. The method according to claim 1, wherein the step of selectively irradiating exposure light comprises the steps of:
    introducing a light blocking blade exposing the modification region at the back surface of the substrate; and
    irradiating the exposure light onto the region modification exposed through the light blocking blade.

5. The method according to claim 1, wherein the implanted ions comprise gallium (Ga) ions.

6. The method according to claim 5, comprising adjusting an amount of reduction of transmittance of the ion-implanted portion of the mask substrate by controlling implantation time of the Ga ions.

7. The method according to claim 1, comprising implanting the ions by using a focused ion beam apparatus.

8. A method for manufacturing a phase shift mask comprising:
    forming a phase shift layer pattern over a transparent substrate;
    transferring the phase shift layer pattern to a wafer to form a wafer pattern;
    selecting a critical dimension modification region requiring line width modification in the wafer pattern transferred on the wafer;
    coating a resist layer covering a front side surface of the mask substrate;
    performing back side exposure on a back side surface of the modification region of the substrate to selectively irradiate a portion of the resist layer between the phase shift mask;
    selectively developing the irradiated portion of the resist layer to form a resist pattern covering and being self-aligned with the phase shift pattern to selectively expose a portion of the substrate between the phase shift pattern;
    varying a light transmittance of the exposed portion of the substrate by implanting ions into the exposed portion using the resist pattern as an ion implantation mask to protect the phase shift pattern from being damaged by the implanting ions; and
    selectively removing the resist pattern.

9. The method according to claim 8, wherein the step of selecting critical dimension modification region comprises the steps of:
    measuring critical dimensions of the wafer pattern;
    extracting a region where the critical dimension of the wafer pattern is varied; and
    selecting a region of the substrate corresponding to the extracted region of critical dimension variation as the critical dimension modification region.

10. The method according to claim 9, wherein the region where the critical dimension of the wafer pattern is varied includes a region provided with light having a relatively high intensity.

11. The method according to claim 8, wherein the step of selectively irradiating exposure light comprises the steps of:
    introducing a light blocking blade exposing the modification region at the back side surface of the substrate; and
    irradiating the exposure light onto the modification region exposed by the light blocking blade.

12. The method according to claim 8, wherein the implanted ions comprise gallium (Ga) ions.

13. The method according to claim 12, comprising adjusting a reduction amount of transmittance of the ion-implanted portion of the substrate by controlling implantation time of the Ga ions.

14. The method according to claim 8, comprising implanting the ions by using a focused ion beam apparatus.

* * * * *